US009318191B2

(12) United States Patent
Kwak et al.

(10) Patent No.: US 9,318,191 B2
(45) Date of Patent: Apr. 19, 2016

(54) PROGRAMMING NONVOLATILE MEMORY DEVICE USING PROGRAM VOLTAGE WITH VARIABLE OFFSET BETWEEN PROGRAMMING STATE DISTRIBUTIONS

(71) Applicants: Dong-Hun Kwak, Hwaseong-si (KR); Hyun-Wook Park, Hwaseong-si (KR); Hyun Jun Yoon, Seongnam-si (KR); Doohyun Kim, Ansan-si (KR); Ki-Tae Park, Seongnam-si (KR)

(72) Inventors: Dong-Hun Kwak, Hwaseong-si (KR); Hyun-Wook Park, Hwaseong-si (KR); Hyun Jun Yoon, Seongnam-si (KR); Doohyun Kim, Ansan-si (KR); Ki-Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 149 days.

(21) Appl. No.: 13/969,651

(22) Filed: Aug. 19, 2013

(65) Prior Publication Data
US 2014/0104955 A1    Apr. 17, 2014

(30) Foreign Application Priority Data
Oct. 11, 2012    (KR) .......................... 10-2012-0112954

(51) Int. Cl.
| G11C 11/56 | (2006.01) |
| G11C 16/12 | (2006.01) |
| G11C 16/04 | (2006.01) |
| H01L 27/115 | (2006.01) |
| G11C 29/02 | (2006.01) |
| G11C 16/10 | (2006.01) |
| G11C 16/34 | (2006.01) |
| G11C 16/00 | (2006.01) |
| G11C 29/04 | (2006.01) |

(52) U.S. Cl.
CPC ........ *G11C 11/5628* (2013.01); *G11C 16/0483* (2013.01); *G11C 16/12* (2013.01); *G11C 16/3459* (2013.01); *G11C 29/021* (2013.01); *G11C 29/028* (2013.01); *H01L 27/1157* (2013.01); *H01L 27/11556* (2013.01); *H01L 27/11582* (2013.01); *G11C 16/00* (2013.01); *G11C 16/10* (2013.01); *G11C 16/3454* (2013.01); *G11C 2029/0409* (2013.01)

(58) Field of Classification Search
CPC .... G11C 16/12; G11C 29/021; G11C 29/028; G11C 16/3459; G11C 16/0483; G11C 16/3454; G11C 16/10; G11C 2029/0409; G11C 16/00; H01L 27/11556; H01L 27/11582; H01L 27/1157
See application file for complete search history.

(56) References Cited

U.S. PATENT DOCUMENTS

| 6,424,569 B1 | 7/2002 | Parker et al. |
| 7,313,019 B2 | 12/2007 | Giduturi et al. |
| 7,656,705 B2 | 2/2010 | Hamilton et al. |
| 7,864,570 B2 | 1/2011 | Oowada |

(Continued)

FOREIGN PATENT DOCUMENTS

KR    10-0953045    4/2010

*Primary Examiner* — Richard Elms
*Assistant Examiner* — Ajay Ojha
(74) *Attorney, Agent, or Firm* — Volentine & Whitt, PLLC

(57) ABSTRACT

A method of programming a nonvolatile memory device comprises applying at least one test program pulse to selected memory cells located in a scan read area, performing a scan read operation on the selected memory cells following application of the at least one test program pulse to detect at least one one-shot upper cell, calculating an offset voltage corresponding to a scan read region at which the scan read operation is performed, setting a program start bias using the offset voltage, and executing at least one program loop using the program start bias.

20 Claims, 14 Drawing Sheets

(56) References Cited

U.S. PATENT DOCUMENTS

| | | |
|---|---|---|
| 7,881,110 B2 | 2/2011 | Park |
| 8,027,194 B2 | 9/2011 | Lee et al. |
| 2005/0133851 A1 | 6/2005 | Forbes |
| 2008/0062760 A1* | 3/2008 | Kim .................. 365/185.03 |
| 2008/0062768 A1 | 3/2008 | Li et al. |
| 2008/0298124 A1 | 12/2008 | Wong |
| 2009/0230454 A1* | 9/2009 | Pekny .................. 257/319 |
| 2010/0082890 A1 | 4/2010 | Heo et al. |
| 2011/0194346 A1 | 8/2011 | Yoon et al. |
| 2011/0205817 A1 | 8/2011 | Yoon et al. |
| 2011/0222342 A1 | 9/2011 | Yoon et al. |
| 2011/0305081 A1* | 12/2011 | Lee .................. 365/185.03 |
| 2012/0020166 A1 | 1/2012 | Ishii |
| 2013/0016565 A1* | 1/2013 | Park et al. .......... 365/185.22 |
| 2013/0159798 A1* | 6/2013 | Yang .................. 714/721 |
| 2013/0176783 A1* | 7/2013 | Senoo et al. ........ 365/185.09 |

* cited by examiner

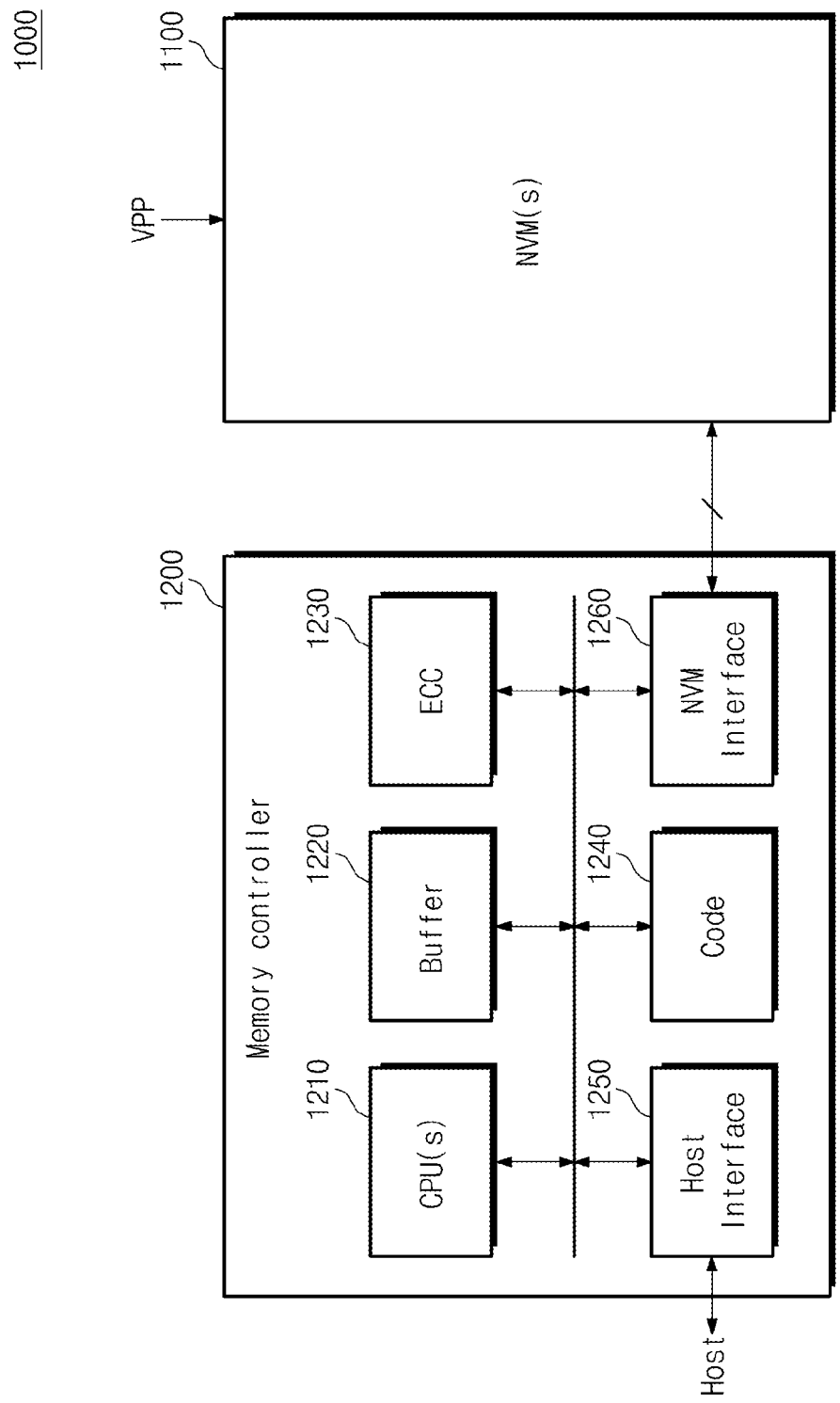

PROGRAMMING NONVOLATILE MEMORY DEVICE USING PROGRAM VOLTAGE WITH VARIABLE OFFSET BETWEEN PROGRAMMING STATE DISTRIBUTIONS

CROSS-REFERENCE TO RELATED APPLICATIONS

This application claims priority under 35 U.S.C. §119 to Korean Patent Application No. 10-2012-0112954 filed Oct. 11, 2012, the subject matter of which is hereby incorporated by reference.

BACKGROUND OF THE INVENTION

The inventive concept relates generally to memory technologies. More particularly, certain embodiments of the inventive concept relate to nonvolatile memory devices and related methods of programming.

Nonvolatile memory devices can be found in a wide variety of electronic devices, including, for instance, tablet computers, mobile phones, digital cameras, and many others. As a consequence of the increasing performance demands of these and other devices, there is a general demand for nonvolatile devices having increased storage capacity. Accordingly, to address this demand, researchers continue to develop techniques for improving existing nonvolatile memory technologies, in addition to developing new nonvolatile memory technologies.

Two common approaches for increasing the storage capacity of nonvolatile memory devices are to decrease the size of memory cells and to increase the number of bits per memory cell. These approaches, however, tend to decease the operating margins of the devices, creating increased possibility of errors. Accordingly, as a complement to the above approaches, researchers also continue to develop approaches for maintaining the reliability of the memory devices.

SUMMARY OF THE INVENTION

In one embodiment of the inventive concept, a method of programming a nonvolatile memory device comprises applying at least one test program pulse to selected memory cells located in a scan read area, performing a scan read operation on the selected memory cells following application of the at least one test program pulse to detect at least one one-shot upper cell, calculating an offset voltage corresponding to a scan read region at which the scan read operation is performed, setting a program start bias using the offset voltage, and executing at least one program loop using the program start bias.

In another embodiment of the inventive concept, a method of programming a nonvolatile memory device comprises determining whether to use an offset index stored at an offset index register according to a block address of a memory block comprising memory cells to be programmed, applying a test program pulse to the memory cells, applying a test verification pulse to the memory cells to verify programming by the test program pulse, performing a scan read operation of the memory cells, changing the offset index in the offset index register according to a result of the scan read operation, setting a program start bias using the offset index, and iterating program loops using the program start bias until a program operation is passed. The scan read operation comprises iterating operations comprising determining whether a number of off cells exceeds a predetermined value, increasing the offset index where the number of off cells does not exceed the predetermined value, and performing a read operation using a scan read voltage corresponding to the offset index, and entering the setting a program start bias where the number of off cells exceeds the predetermined value.

In yet another embodiment of the inventive concept, a nonvolatile memory device comprises a controller configured to apply at least one test program pulse to selected memory cells located in a scan read area, perform a scan read operation on the selected memory cells following application of the at least one test program pulse to detect at least one one-shot upper cell, calculate an offset voltage corresponding to a scan read region at which the scan read operation is performed, set a program start bias using the offset voltage, and execute at least one program loop using the program start bias.

These and other embodiments of the inventive concept can potentially improve performance and power consumption of nonvolatile memory devices by calculating an offset using a scan read operation and performing a program operation using the offset calculated.

BRIEF DESCRIPTION OF THE DRAWINGS

The drawings illustrate selected embodiments of the inventive concept. In the drawings, like reference numbers indicate like features.

FIG. 15 is a block diagram illustrating a memory system according to an embodiment of the inventive concept.

DETAILED DESCRIPTION

Figure 1:
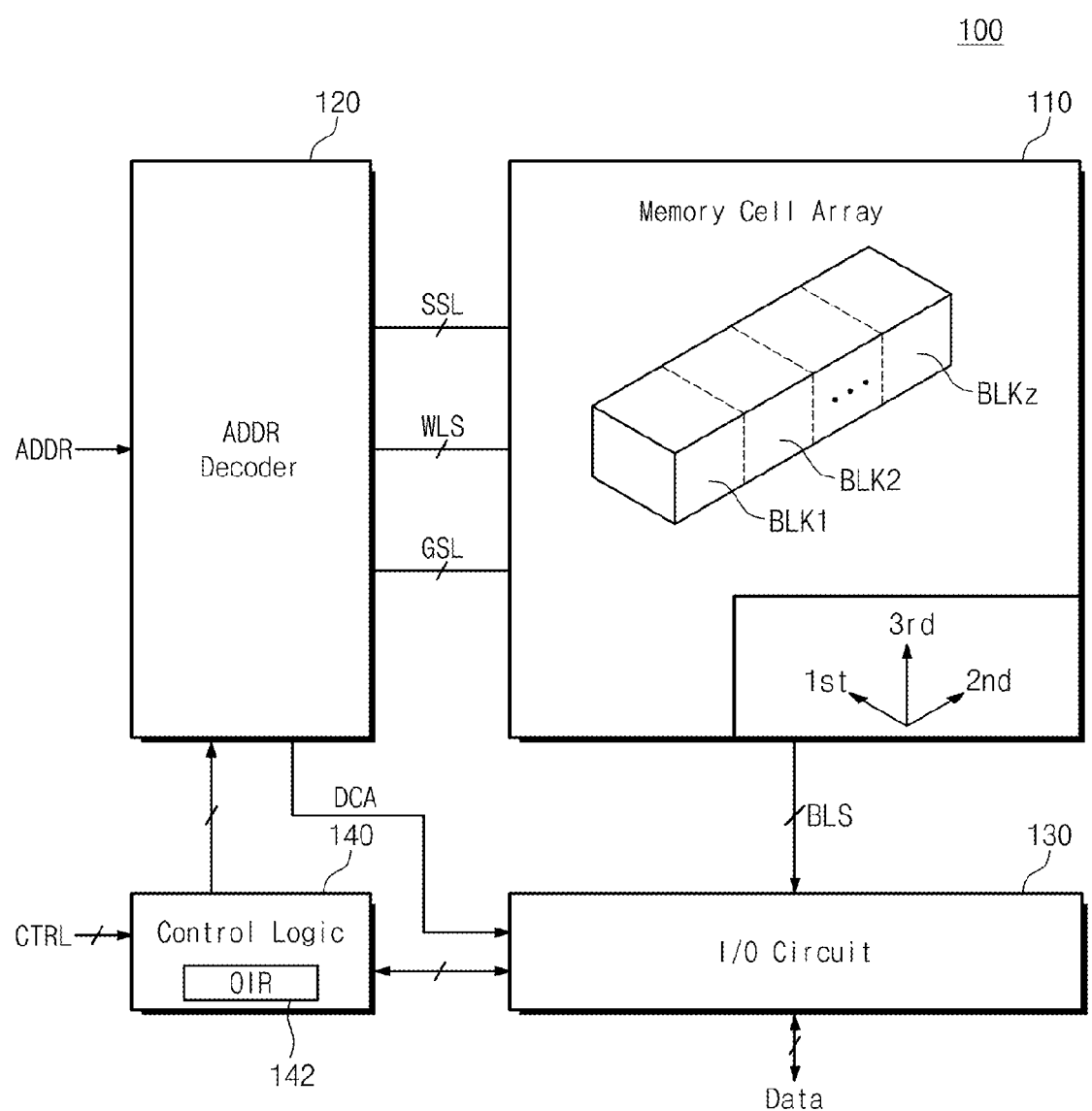
FIG. 1 is a block diagram of a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram of a nonvolatile memory device according to an embodiment of the inventive concept.

Referring to FIG. 1, a nonvolatile memory device 100 comprises a memory cell array 110, an address decoder 120, an input/output circuit 130, and control logic 140.

Memory cell array 110 is connected to address decoder 120 through word lines, at least one string selection line SSL, and at least one ground selection line GSL and to input/output circuit 130 through bit lines. Memory cell array 110 comprises multiple memory blocks BLK1 to BLKz each comprising multiple three-dimensional memory cells arranged along a first direction, a second direction different from the first direction, and a third direction perpendicular to a plane formed in the first and second directions.

Address decoder 120 is connected to memory cell array 110 via word lines WL, at least one string selection line SSL, and at least one ground selection line GSL. Address decoder 120 selects word lines WL, the at least one string selection line SSL, and the at least one ground selection line GSL using a decoded row address. Address decoder 120 decodes a column address of an input address ADDR, and a resulting decoded column address DCA is transferred to input/output circuit 130. In some embodiments, address decoder 120 comprises a row decoder, a column decoder, an address buffer, and so on.

Input/output circuit 130 is connected to memory cell array 110 via the bit lines. Input/output circuit 130 selects the bit lines using the decoded column address DCA from address decoder 120.

Input/output circuit 130 receives data from an external device (e.g., a memory controller) and stores it in memory cell array 110. Input/output circuit 130 reads data from memory cell array 110 and outputs it to the external device. Input/output circuit 130 further reads data from a first region of memory cell array 110 and stores it in a second region thereof. In some embodiments, input/output circuit 130 is configured to perform a copy-back operation.

Control logic 140 is configured to control an overall operation of the nonvolatile memory device 100. Control logic 140 operates responsive to control signals CTRL or a command transferred from the external device. Control logic 140 performs a scan read operation to calculate an offset voltage for a one-shot program operation.

The term "one-shot program operation" refers to a multi-bit program operation in multiple data values are programmed to a selected memory cell (or cells) by changing its threshold voltage from an initial state to a target state. For instance, in a one-shot program operation may program two bits to a two-bit memory cell by changing its threshold voltage from an erase state to a programmed state. As will be apparent from the following description, the change of threshold voltage may be performed, for instance, using an incremental step pulse programming (ISPP) technique.

The offset voltage for the one-shot program operation is a value indicating an adjustment to a program voltage used in the one-shot program operation. For instance, the value can be applied as a bias to an initial program voltage used in the ISPP technique. The value typically reflects contextual information about memory cells to be one-shot programmed, such as a structural location, a level of deterioration, a temperature.

The scan read operation comprises a read operation performed on a predetermined read area (hereinafter, referred to as a "scan read area") in a predetermined interval. Control logic 140 typically performs the scan read operation to detect off cells among selected memory cells after applying of a test pulse (a test program pulse and a test verification pulse) to the selected memory cells, and it calculates the offset voltage for the scan read area for which the scan read operation is performed.

Control logic 140 comprises an offset index register (OIR) 142 that stores an offset index corresponding to an offset voltage. Control logic 140 changes a program start bias of at least one program loop using the offset index stored at the offset index register 142.

Figure 2:
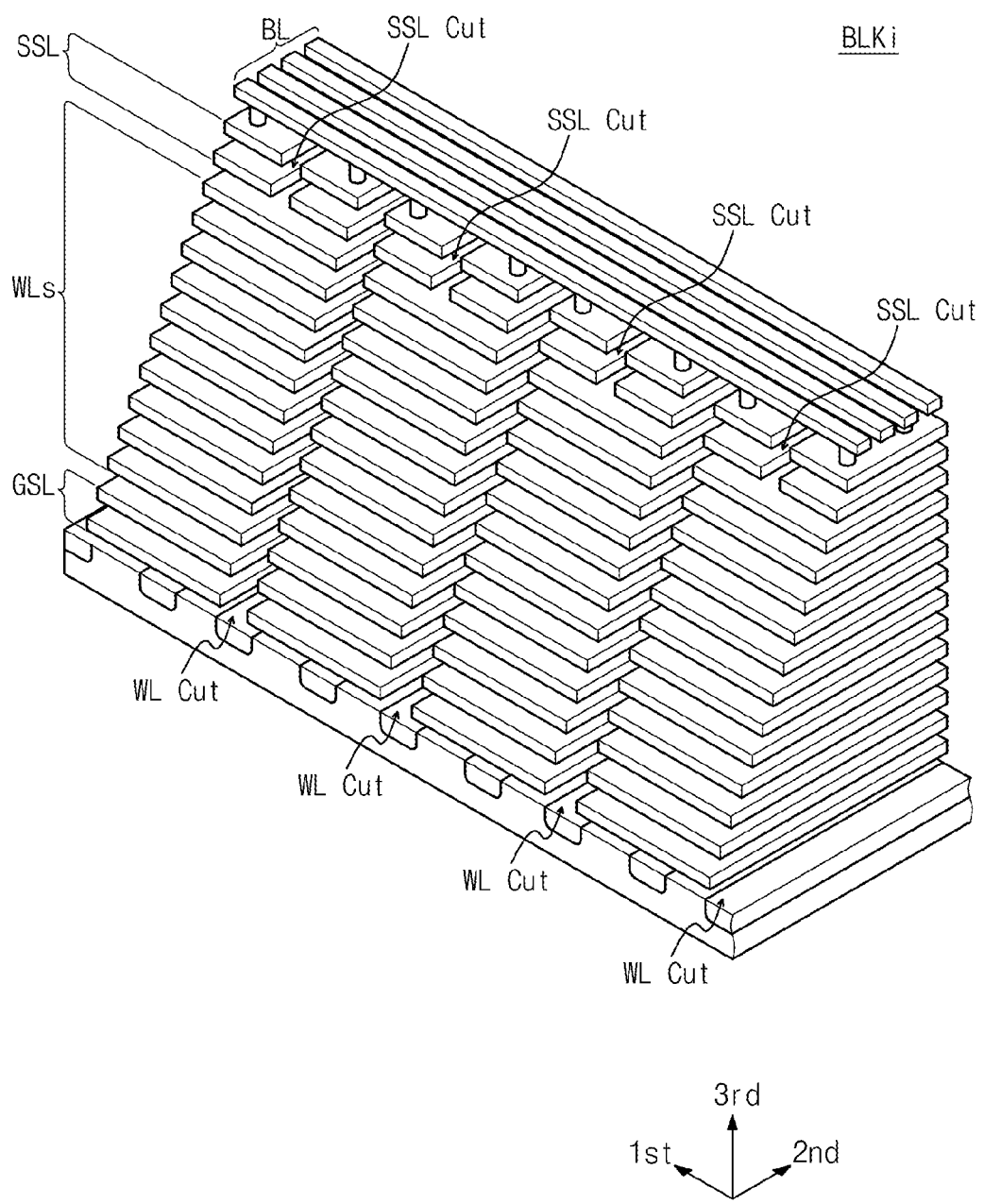
FIG. 2 is a perspective view of a memory block in FIG. 1 according to an embodiment of the inventive concept.

FIG. 2 is a perspective view of a memory block in FIG. 1 according to an embodiment of the inventive concept.

Referring to FIG. 2, four sub-blocks are formed on a substrate. Each of the sub-blocks is formed by stacking at least one ground selection line GSL, multiple word lines WL, and at least one string selection line SSL on the substrate and separating a resultant structure by word line cuts WL Cut. Herein, at least one string selection line SSL is separated by string selection line cuts SSL Cut. Although not illustrated in FIG. 2, each of the word line cuts WL Cut may comprise a common source line CSL. Common source lines included in the word line cuts WL Cut are connected in common.

In the example of FIG. 2, a structure between word line cuts is assumed to be a sub-block. However, the inventive concept is not limited thereto. For example, a structure between a word line cut and a string selection line cut can be defined as a sub-block.

A block according to an embodiment of the inventive concept may have a merged word line structure in which two word lines are merged into one.

Figure 3:
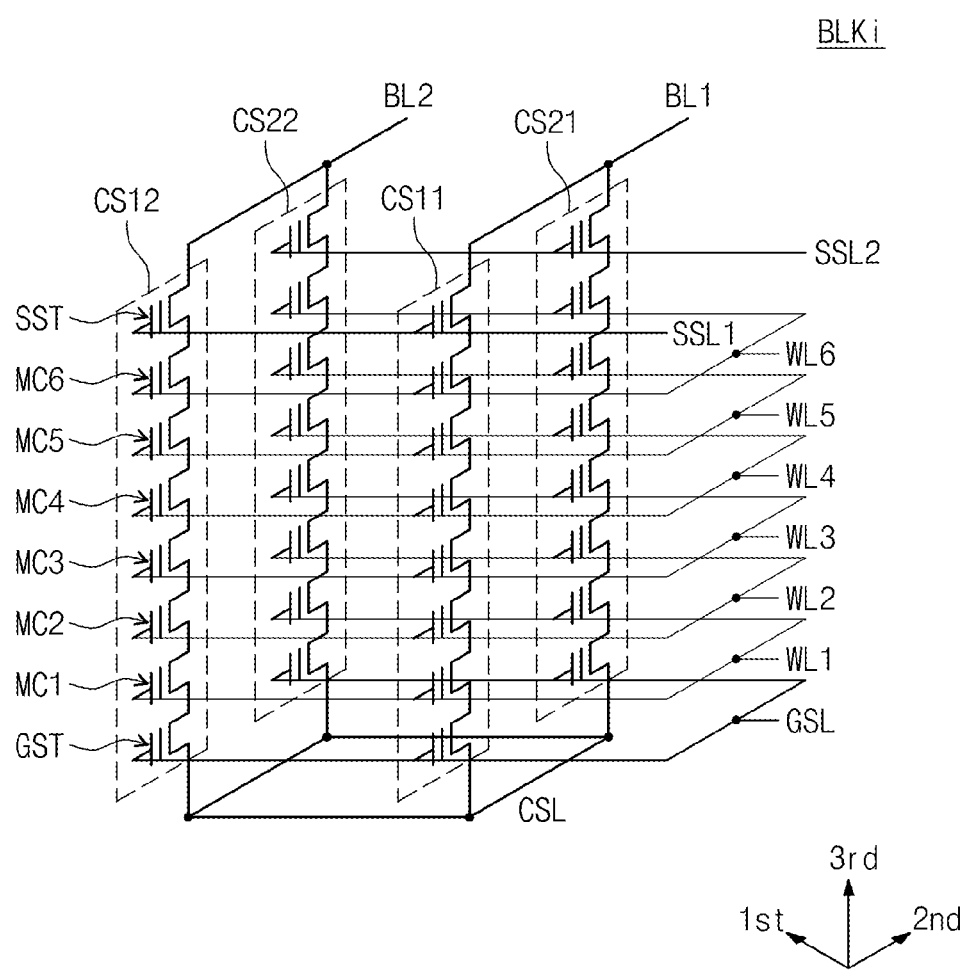
FIG. 3 is a diagram illustrating an equivalent circuit of the memory block in FIG. 1 according to an embodiment of the inventive concept.

FIG. 3 is a diagram illustrating an equivalent circuit of a memory block according to an embodiment of the inventive concept.

Referring to FIG. 3, a memory blocks BLKi comprises cell strings CS11, CS12, CS21, and CS22 each comprising a string selection transistor SST, a ground selection transistor GST, and memory cells MC1 to MC6. In each of cell strings CS11, CS12, CS21, and CS22, memory cells MC1 to MC6 are connected between string selection transistor SST and ground selection transistor GST.

Control gates of ground selection transistors GST in cell strings CS11, CS12, CS21, and CS22 are connected in common to a ground selection line GSL. One end of each ground selection transistor GST is connected to memory cells MC1, and another other end is connected in common to a common source line CSL.

In cell strings CS11, CS12, CS21, and CS22, memory cells MC1 are connected in common to a word line WL1, memory cells MC2 are connected in common to a word line WL2, memory cells MC3 are connected in common to a word line WL3, memory cells MC4 are connected in common to a word line WL4, memory cells MC5 are connected in common to a word line WL5, and memory cells MC6 are connected in common to a word line WL6.

In cell strings CS11 and CS12, control gates of string selection transistors SST are connected to a string selection line SSL1. In cell strings CS21 and CS22, control gates of the string selection transistors SST are connected to a string selection line SSL2. In cell strings CS11 and CS21, one end of each string selection transistor SST is connected to a bit line BL1, and another end is connected to memory cells MC6. In cell strings CS12 and CS22, one end of each string selection transistor SST is connected to a bit line BL2, and another end is connected to memory cells MC6.

For ease of description, rows, columns, and heights may be defined. A direction in which string selection lines SSL1 and SSL2 extend may be a row direction (or, a first direction). Cell strings CS11 and CS12 are arranged along the row direction to form a first row. Cell strings CS21 and CS22 are arranged along the row direction to form a second row.

A direction in which bit lines BL1 and BL2 extend may be a column direction (or, a second direction). Cell strings CS11 and CS21 may be arranged along the column direction to form a first column. Cell strings CS12 and CS22 may be arranged along the column direction to form a second column. A direction proceeding from ground selection transistors GST to string selection transistors SST may be a height.

Memory cells MC1 and MC6 form a three-dimensional structure in which memory cells MC1 to MC6 are arranged along the row and column directions and stacked along a height direction (or, a third direction). Memory cells at the same height are connected in common to a word line, and memory cells at different heights are connected to respective word lines. String selection transistors SST in the same row are connected in common to a string selection line SSL1/SSL2, and string selection transistors SST in different rows are connected to respective string selection lines SSL1 and SSL2. String selection transistors SST in the same column are connected to the same bit line BL1/BL2, and string selection transistors SST in different columns are connected to respective bit lines BL1 and BL2.

Each of memory cells MC1 to MC6 may store two or more bits. In other words, each of memory cells MC1 to MC6 may be a multi-level cell.

Although FIG. 3 shows a memory block BLKi comprising four cell strings CS11, CS12, CS21, and CS22, the inventive concept is not limited to this number of cell strings. In general, at least two or more cell strings may be provided along a row direction or a column direction. Similarly, although FIG. 3 shows each cell string comprising six memory cells MC1 to MC6, the inventive concept is not limited to this number of memory cells in each cell string. In general, each cell string may comprise two or more memory cells along the height direction. Although FIG. 3 shows ground selection transistors GST connected in common to a ground selection line GSL, memory block BLKi may be changed or modified such that ground selection transistor GST in the same row are connected in common to a ground selection line and ground selection transistor GST in another row are connected in common to another ground selection line. Although FIG. 3 shows each cell string comprising a string selection transistor SST and a ground selection transistor GST, in general, each cell string can be configured to include two or more string selection transistors SST and two or more ground selection transistors GST. In various embodiments, at least one of memory cells MC1 to MC6 in each cell string may be used as a dummy memory cell.

A nonvolatile memory device according to certain embodiments of the inventive concept may perform a multi-bit program operation using a one-shot program operation using an offset (e.g., an offset voltage, an offset time, etc.).

Figure 4:
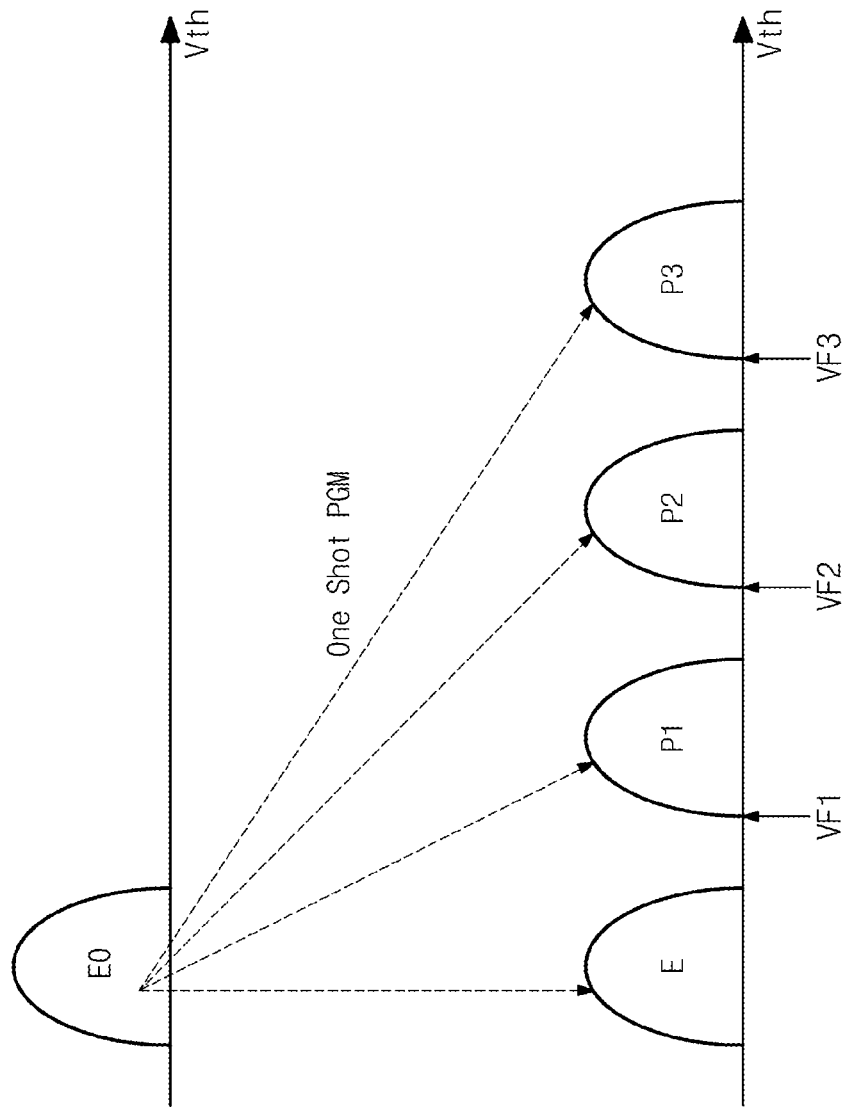
FIG. 4 is a diagram illustrating a one-shot program operation according to an embodiment of the inventive concept.

FIG. 4 is a diagram illustrating a one-shot program operation according to an embodiment of the inventive concept. The one-shot program operation of FIG. 4 is used to program a 2-bit MLC.

Referring to FIG. 4, the one-shot program operation changes an original erase state E0 to one of an erase state E, a first program state P1, a second program state P2, and a third program state P3. FIG. 4 illustrates a first verification voltage VF1 for verifying first program state P1, a second verification voltage VF2 for verifying second program state P2, and a third verification voltage VF3 for verifying third program state P3.

For ease of description, it is assumed that a nonvolatile memory device 100 is a vertical NAND flash memory device (or, called "VNAND"). An offset may exist between memory blocks or between word lines according to a process variation in A VNAND structure. A conventional nonvolatile memory device may change a program start bias of an MSB program operation according to the number of program pulses applied at an LSB program operation to revise such offset. However, it may be difficult to apply the one-shot program operation to the conventional nonvolatile memory device. The reason may be that the one-shot program operation does not include the LSB program operation. Further, it is difficult to use the number of program pulses applied as an offset between word lines. On the other hand, the inventive concept may include detecting an offset according to a structural cell characteristic using a scan read operation and performing a one-shot program operation using the detected offset.

Figure 5:
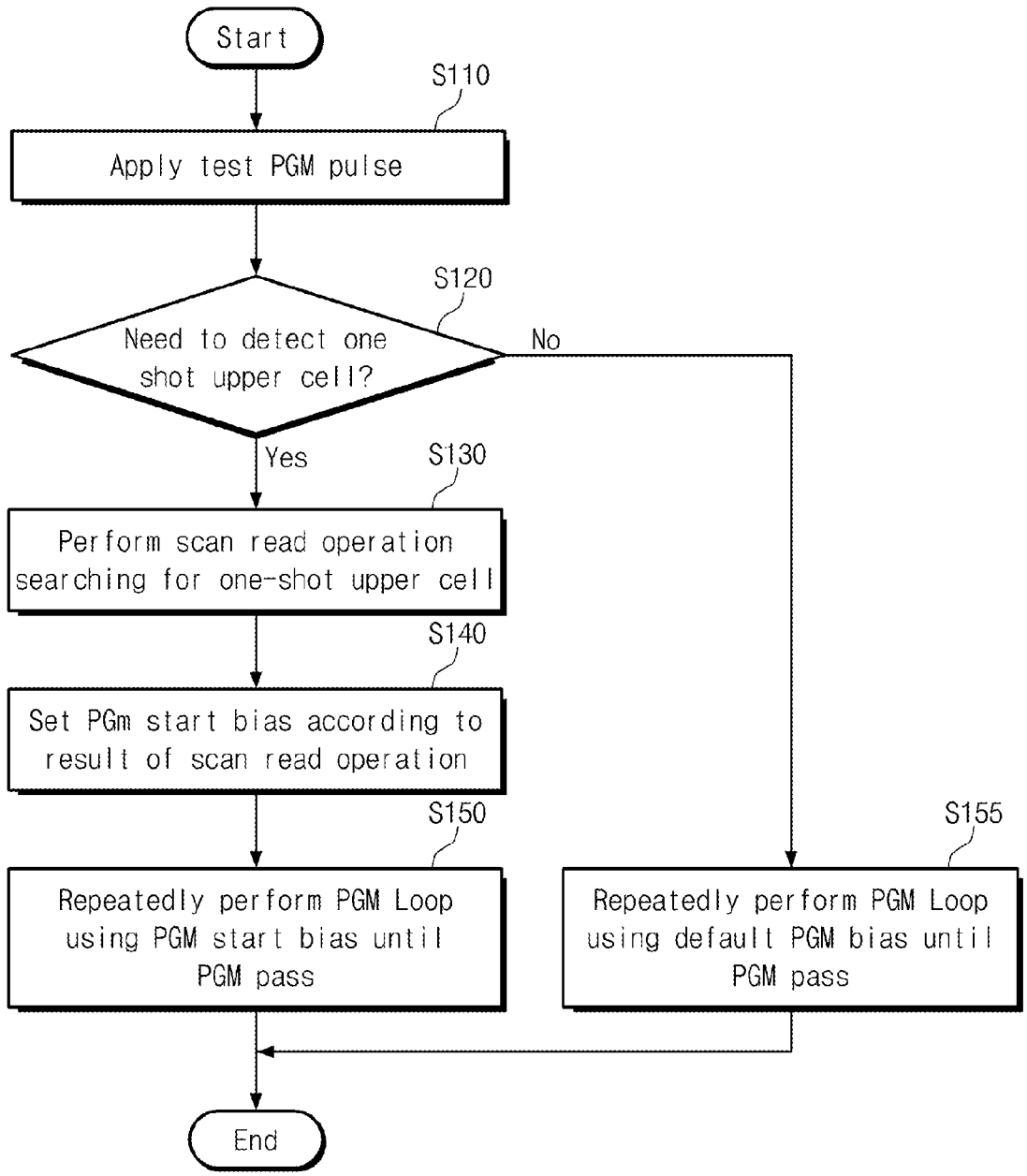
FIG. 5 is a flowchart illustrating a method of programming a nonvolatile memory device according to an embodiment of the inventive concept.

FIG. 5 is a flowchart illustrating a method of programming a nonvolatile memory device according to an embodiment of the inventive concept.

Referring to FIGS. 1 to 5, in operation S110, a test program pulse is applied to memory cells. Herein, the test program pulse may have a predetermined level. Afterwards, in operation S120, the method determines whether to detect one-shot upper cells. As used herein, the term "one-shot upper cell" refers to a memory cell whose threshold voltage changes by a predetermined amount in response to the test program pulse. In certain embodiments, the detection of one-shot upper cells is accomplished according to a result of a verification operation performed using a predetermined verification voltage. For example, a selected memory cell may be detected as a one-shot upper cell where a result of the verification operation indicates that the selected memory cell is an off cell.

In operation S130, a scan read operation on a predetermined area is performed to detect one-shot upper cells. Herein, the predetermined area may be changed according to contextual information such as a temperature of a nonvolatile memory device 100, wear-leveling (e.g., P/E cycle) of a memory block including memory cells, an address of a memory block including memory cells, and so on.

In operation S140, a program start bias is determined according to a result of the scan read operation. For example, if the number of one-shot upper cells exceeds a predetermined value, a default level of the program start bias may increase by a predetermined offset value.

In operation S150, program loops are iterated using the determined program start bias until a program operation is passed. Returning to operation S120, if a one-shot upper cell detection operation is not required, in operation S155, program loops may be iterated using a default program start bias.

The method in FIG. 5 comprises detecting one-shot upper cells (S120), but the inventive concept is not limited thereto. For example, the method of FIG. 5 can be modified to include directly performing the scan read operation to calculate an offset voltage without detecting of one-shot upper cells and determining the program start bias according to a calculated offset voltage.

Figure 6:
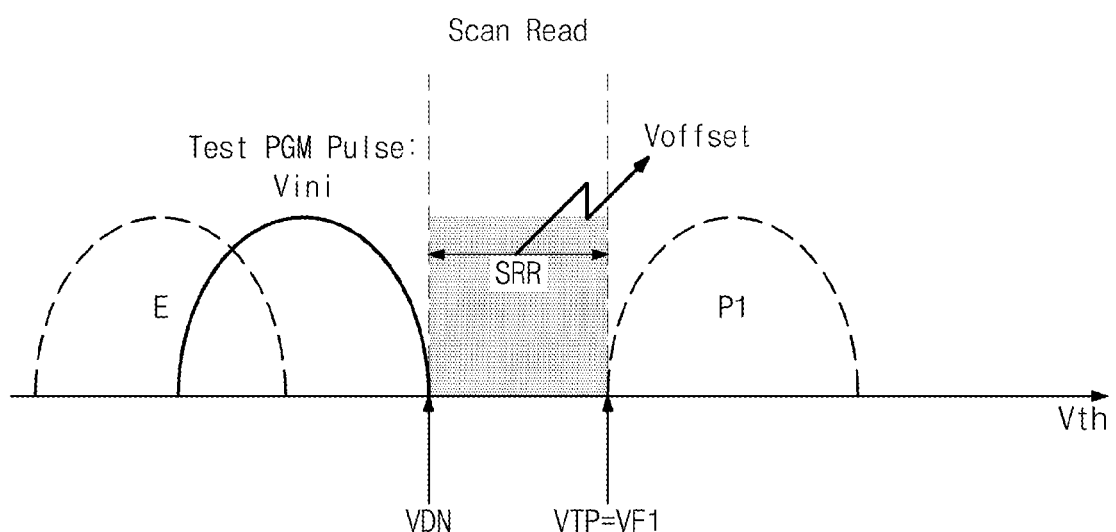
FIG. 6 is a threshold voltage diagram illustrating a method of programming a nonvolatile memory device according to an embodiment of the inventive concept.

FIG. 6 is a diagram illustrating a method of programming a nonvolatile memory device according to an embodiment of the inventive concept.

Referring to FIG. 6, an offset voltage is determined by applying a loop start voltage Vini to selected memory cells, performing a verification read operation using a verification voltage VF1 of a first program state P1, determining whether to perform a scan read operation according to a result of the verification read operation, and performing a scan read operation on a scan read region SRR on the basis of the verification voltage VF1.

In some embodiments, the scan read operation is performed under conditions where a top point VTP decreases by a predetermined voltage. The predetermined voltage may be, for instance, a unit voltage in the ISPP technique. Where the scan read operation progresses downward, the top point VTP of the scan read region SRR may correspond to the first verification voltage VF1, and a down point VDN thereof may correspond to a voltage at which one-shot upper cells are first detected (i.e., off cells are first detected).

In some other embodiments, the scan read operation may be performed under conditions where down point VDN increases by a predetermined voltage. When the scan read operation progresses upward, top point VTP of the scan read region SRR may correspond to a voltage when the number of one-shot upper cells does not exceed a predetermined number, and the down point VDN may be a predetermined voltage (e.g., a read voltage on P1). Scan read region SRR is not necessarily limited to the above description, and can take alternative forms.

As indicated by the foregoing, the one-shot program operation may change a program start bias of at least a next program loop according to an offset voltage Voffset corresponding to the scan read region SRR. For example, if the scan read region SRR is detected to be relatively wide, a program start bias may be higher than that when the scan read region SRR is relatively narrow. On the other hand, if the scan read region SRR is detected to be relatively narrow, a program start bias may lower than that when the scan read region SRR is relatively wide. In case of a program operation where the scan read region SRR is unnecessary, a default program start bias may be used.

Figure 7:
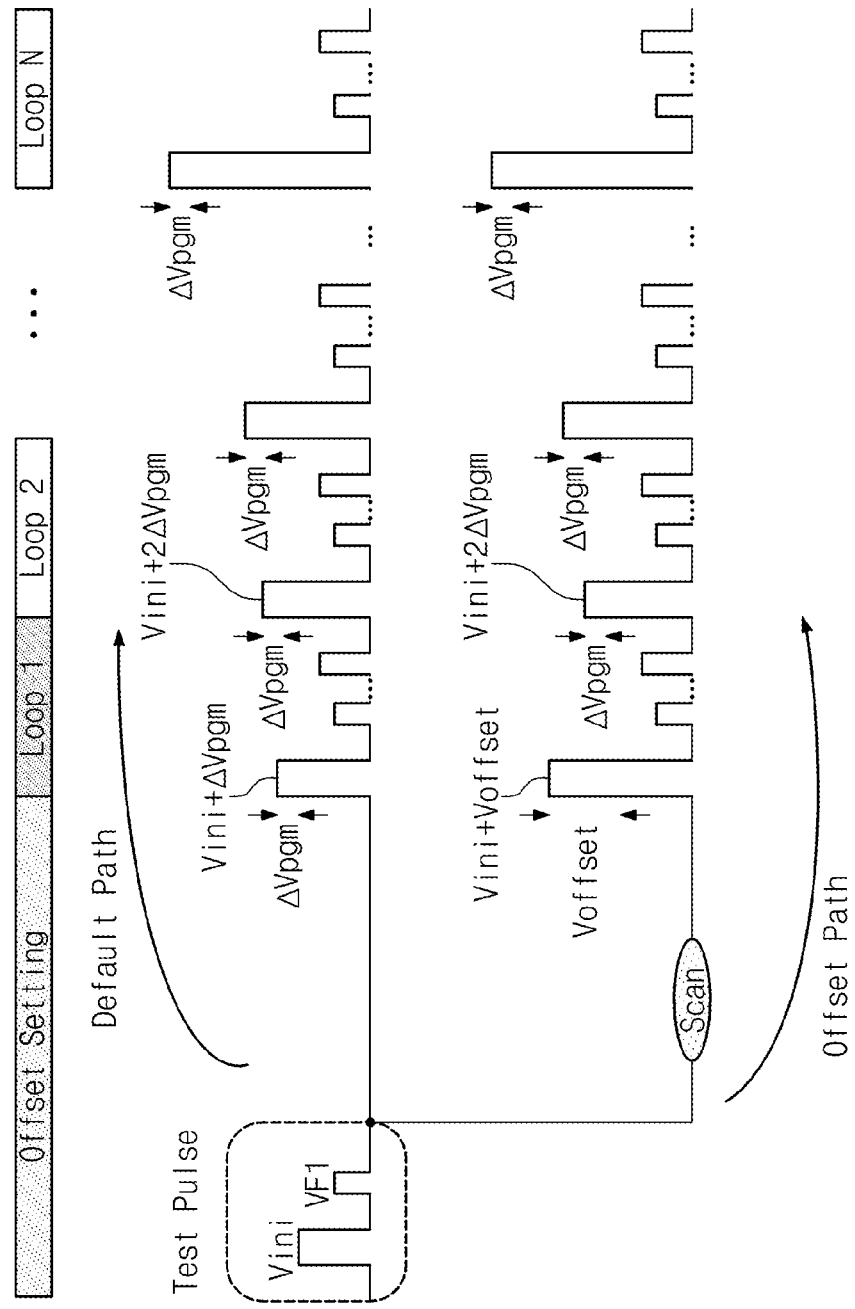
FIG. 7 is a timing diagram for the method of FIG. 5.

FIG. 7 is a timing diagram for the method of FIG. 6.

Referring to FIG. 7, the method comprises an offset setting period and program loops. In the offset setting period, after a test program pulse of a loop start voltage Vini is applied, a verification operation is performed using a test verification pulse of a first verification voltage VF1. Whether to perform program loops Loop1 to Loop N in a default path or in an offset path is determined according to a result of the verification read operation. For example, if a result of the verification read operation indicates that the number of off cells exceeds a predetermined number, a one-shot program operation may be performed via the default path. On the other hand, if a result of the verification read operation indicates that the number of off cells is less than the predetermined number, the one-shot program operation may be performed via the offset path.

Although FIG. 7 illustrates an example in which a test program pulse is applied, the inventive concept is not limited thereto. For example, at least two test pulses may be applied in the offset setting period. In this case, the at least two test pulses may have the same level or different levels. Although FIG. 7 illustrates an example in which a test verification pulse of the first verification voltage VF1 is applied, the inventive concept is not limited thereto. For example, in the offset setting period, a verification read operation may be performed using a test verification pulse after at least one test program pulse is applied.

As illustrated in FIG. 7, the offset setting period may include a scan read operation for detecting one-shot upper cells. An offset voltage Voffset applied to a program start bias may be determined according to a result of the scan read operation.

A program loop period may proceed differently according to the default and offset paths. First, referring to the default path, at a first program loop Loop 1, a first program pulse (Vini+ΔVpgm) higher by a loop increment ΔVpgm than loop start voltage Vini is applied and verification operations may be performed using multiple verification pulses. Herein, the loop increment ΔVpgm may have a constant value or a value varied according to the number of loops. Herein, the verification pulses may be voltages corresponding to multiple program states (e.g., P1, P2, and P3 in FIG. 4).

In the default path, at a second program loop Loop 2, a second program pulse (Vini+2 ΔVpgm) higher by the loop increment ΔVpgm than the first program pulse is applied and verification operations may be performed using the verification pulses. The remaining program loops in the default path may be performed in the same manner as described above.

In the offset path, a program start bias (Vini+Voffset) determined according to a scan read operation is applied to a first program loop. The remaining program loops in the offset path may be performed substantially the same as the default path. Herein, the program start bias may include loop start voltage Vini and offset voltage Voffset. Herein, offset voltage Voffset may be a voltage corresponding to a scan read region SRR (See, FIG. 6).

In particular, in the offset path, at a first program loop Loop 1, a first program pulse of a program start bias (Vini+Voffset) is applied and verification operations are performed using the verification pulses. In a second program loop Loop 2, a second program pulse (Vini+2ΔVpgm) higher by the loop increment ΔVpgm than the first program pulse (Vini+A Vpgm) is applied and verification operations are performed using the verification pulses. The remaining program loops are performed the same as the default path.

Figure 8:
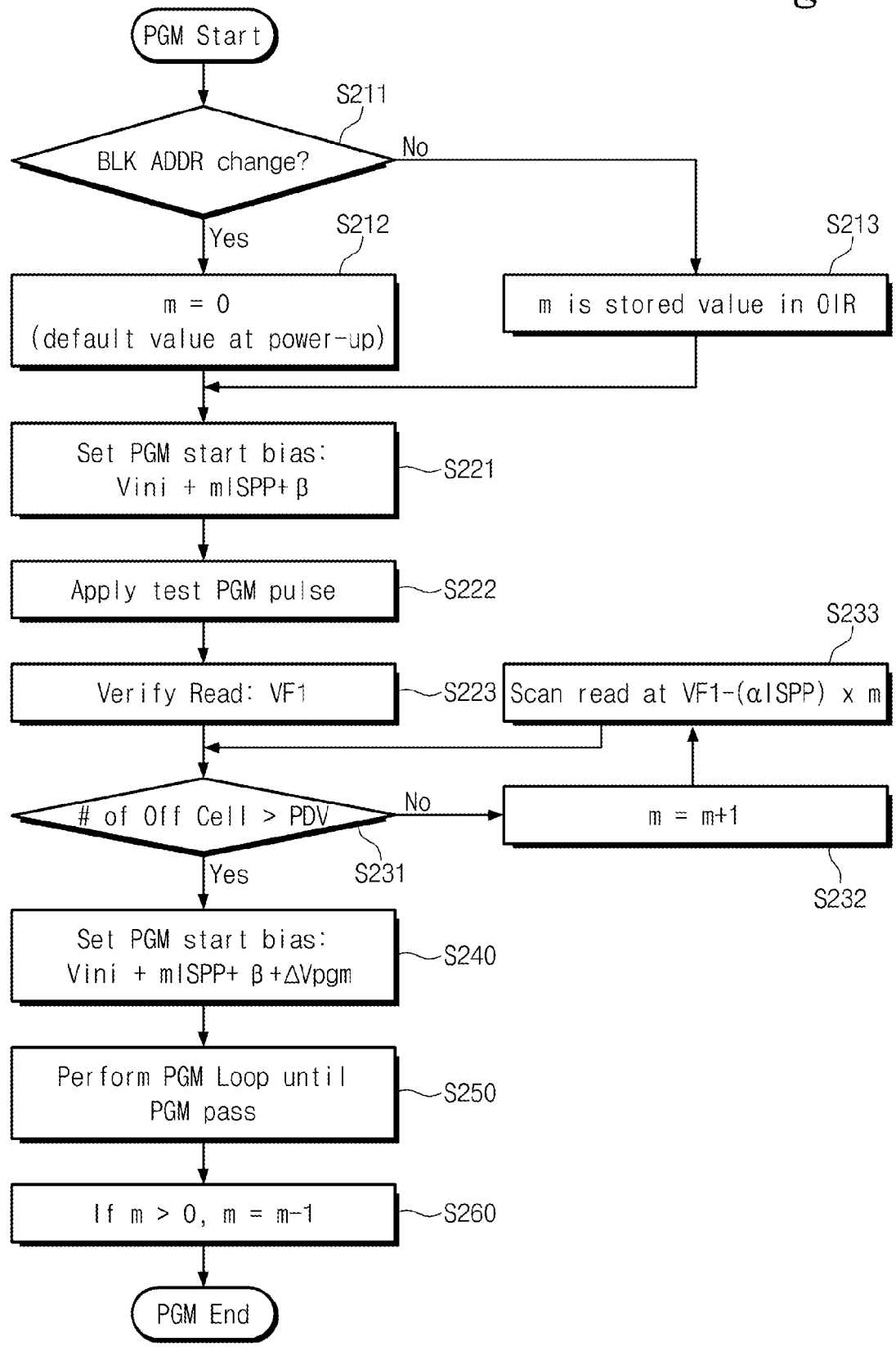
FIG. 8 is a flowchart illustrating a method of programming a nonvolatile memory device according to an embodiment of the inventive concept.

FIG. 8 is a flowchart illustrating the method of FIG. 6 according to an embodiment of the inventive concept. For convenience, the method of FIG. 8 will be described with reference to the device of FIG. 1, although the method is not limited to this device.

A program command, an address, and write data are provided to a nonvolatile memory device 100. In operation S211, control logic 140 of nonvolatile memory device 100 determines whether a block address of the input address is different from a block address of a previous program operation. If a block address of the input address is different from a block address of a previous program operation, in operation S212, an offset index m is a default value (e.g., 0). Herein, the default value is stored at offset index register 142 at power-up of the nonvolatile memory device 100. If a block address of the input address is different from a block address of a previous program operation, in operation S213, the offset index m may be a value stored in offset index register 142.

In operation S221, control logic 140 sets a program start bias using the offset index m stored at the offset index register 142. For example, the program start bias may be formed of a loop start voltage Vini and an offset voltage Voffset (mISPP+β). Herein, "m" may be an offset index, "ISPP" may be a unit voltage for execution of a scan read operation, and "β" may be an offset value corresponding to a word line layer. In example embodiments, the offset value β may be selected from a mapping table formed of an offset values and addresses.

In operation S222, a first program pulse according to the program start bias is applied. In operation S223, a read operation is performed using a first verification voltage VF1. In operation S231, control logic 140 determines whether the number of off cells exceeds a predetermined value PDV, based on a result of the read operation. In example embodiments, the number of off cells may be determined using a mass bit detection manner.

If the number of off cells does not exceed the predetermined value PDV, in operation S232, control logic 140 increases the offset index m by 1. In operation S233, a read operation (e.g., a part of a scan read operation) may be performed using a scan read voltage (VF1−(αISPP)×m). Herein, "α" may be a correlation coefficient between a threshold voltage level and a program pulse, "ISPP" may be a unit voltage, and "m" may be an offset index. Afterwards, the method proceeds to operation S231.

Returning to operation S231, if the number of off cells is determined to exceed the predetermined value PDV, in operation S240, control logic 140 sets the program start bias anew. Herein, the program start bias newly set may be formed of loop start voltage Vini, offset voltage Voffset (mISPP+β), and a loop increment ΔVpgm.

In operation S250, a program loop may be iterated according to one of a default path and an offset path (See, FIG. 7) until a program operation is passed. A program operation may be failed when a program operation is not passed at a last program loop.

In operation S260, if the offset index m is larger than "0", control logic 140 may store a value of (m−1) as a new offset index m at the offset index register 142. Herein, operation S260 may be performed to prevent memory cells of a next word line from being over-programmed. A manner of controlling an offset index m for prevention of over-programming may not be limited to this disclosure. Control logic 140 may determine a value of (m−2) as a new offset index m. In other example embodiments, the operation S260 may be skipped.

Figure 9:
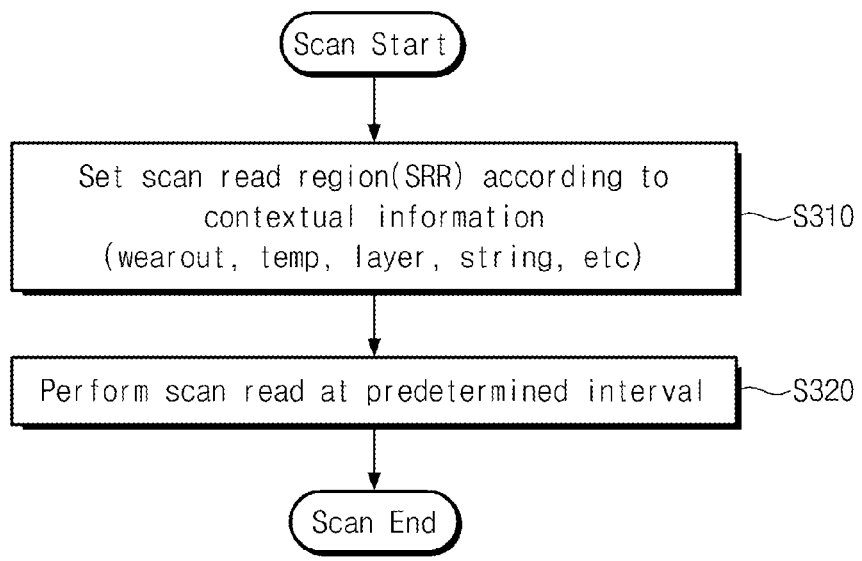
FIG. 9 is a flowchart illustrating a scan read method according to an embodiment of the inventive concept.

FIG. 9 is a flowchart illustrating a scan read method according to an embodiment of the inventive concept.

Referring to FIG. 9, in operation S310, control logic 140 sets a scan read region SRR according to contextual information of a nonvolatile memory device 100. The contextual information of the nonvolatile memory device 100 may include, for instance, wear-leveling (e.g., P/E cycle) of a memory block, a temperature of the nonvolatile memory device 100 (e.g., from an embedded temperature detector), a layer corresponding to a word line (including information corresponding to an input address), a string including a memory cell to be driven (including information corresponding to an input address), and so on. A top point VTP and a down point VDN (See, FIG. 6) for a scan read operation may be changed according to the contextual information. In operation S320, the scan read operation may be performed by a predetermined interval (e.g., αISPP: See, FIG. 8). Herein, "α" may be a correlation coefficient between a threshold voltage level and a program pulse, and "ISPP" may be a unit voltage.

In the examples of FIGS. 6 to 9, a loop start voltage Vini is used as a test program pulse for offset setting. However, the inventive concept is not limited thereto. For example, a dummy voltage Vdummy higher than loop start voltage Vini may be used as a test program pulse at the offset setting period to better express a characteristic of a one-shot program operation.

Figure 10:
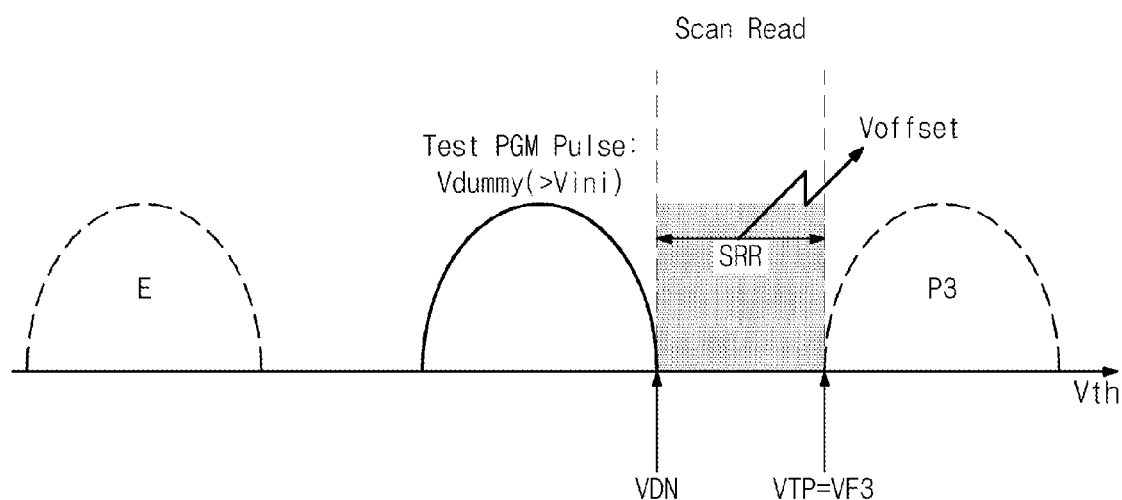
FIG. 10 is a diagram illustrating a method of programming a nonvolatile memory device according to an embodiment of the inventive concept.

FIG. 10 is a diagram illustrating a method of programming a nonvolatile memory device according to another embodiment of the inventive concept.

Referring to FIG. 10, a dummy voltage Vdummy higher than loop start voltage Vini is applied as a test program pulse, a read operation is performed using a verification voltage VF3 of a third program state P3, whether to perform a scan read operation may be determined according to a result of the read operation, and a scan read operation on a scan read region SRR may be performed from a verification voltage VF3. Although FIG. 10 illustrates an example in which verification voltage VF3 of third program state P3 is used as a test read pulse to determine a scan read operation, the inventive concept is not limited thereto. A test read pulse used to determine a scan read operation may be determined arbitrarily in connection with a dummy voltage Vdummy.

Figure 11:
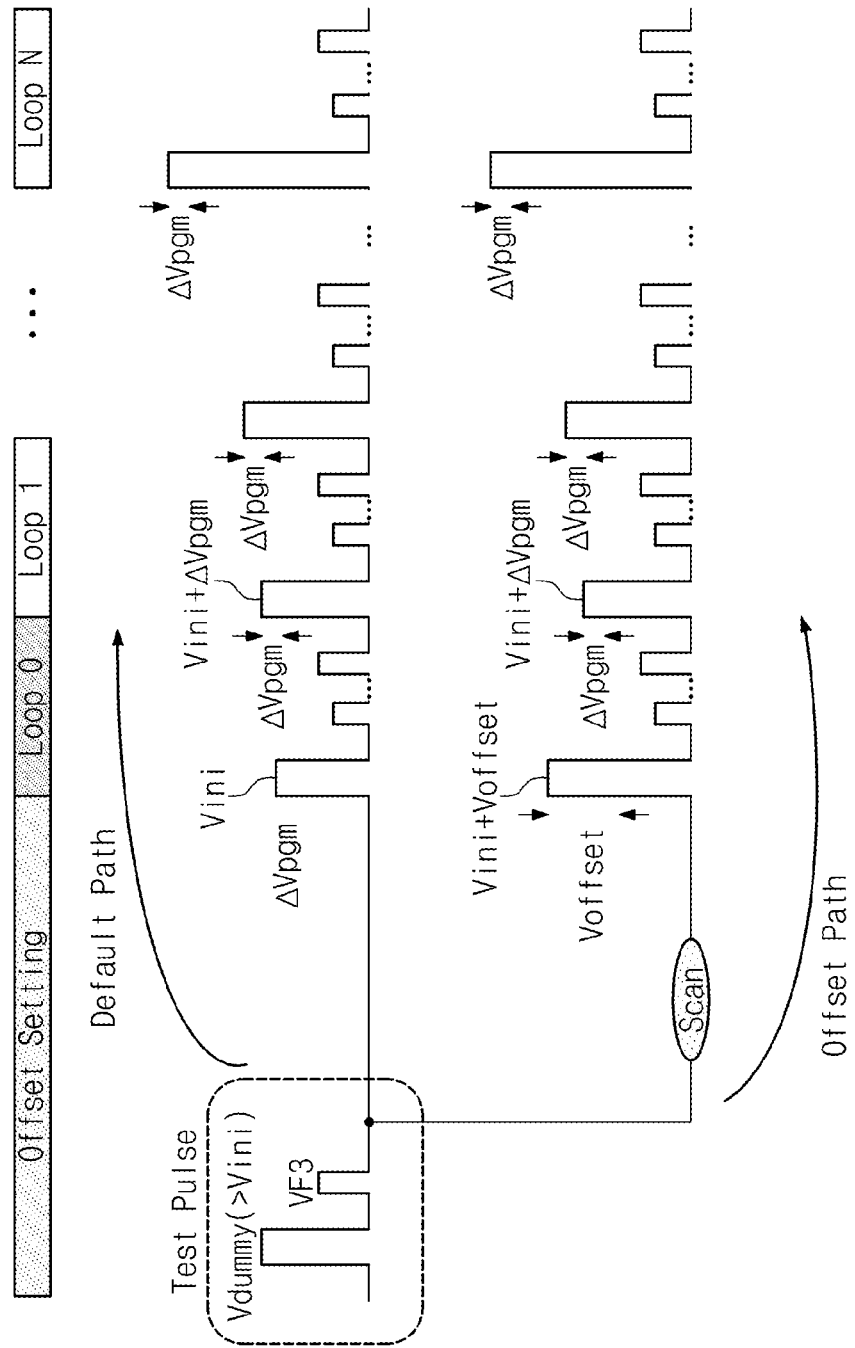
FIG. 11 is a timing diagram for the method of FIG. 10.

FIG. 11 is a timing diagram for the method of FIG. 10.

Referring to FIG. 11, a method comprises an offset setting period and program loops. In the offset setting period, after a dummy voltage Vdummy is applied as a test program pulse, a verification read operation may be performed using a third verification voltage VF3, and whether to perform a one-shot program operation in a default or an offset path may be determined according to a result of the verification read operation.

A program loop period may proceed differently according to the default and offset paths. In contrast to the embodiment of FIG. 8, in case of the default path, a program loop proceeds from a program pulse according to a loop start voltage Vini. In the offset path, a program start bias (Vini+Voffset) determined according to a scan read operation is applied to a program loop Loop 0, and the remaining program loops may be performed the same as the default path. Herein, the program start bias comprises loop start voltage Vini and an offset voltage Voffset. Offset voltage Voffset is a voltage corresponding to a scan read region SRR (See, FIG. 10).

Figure 12:
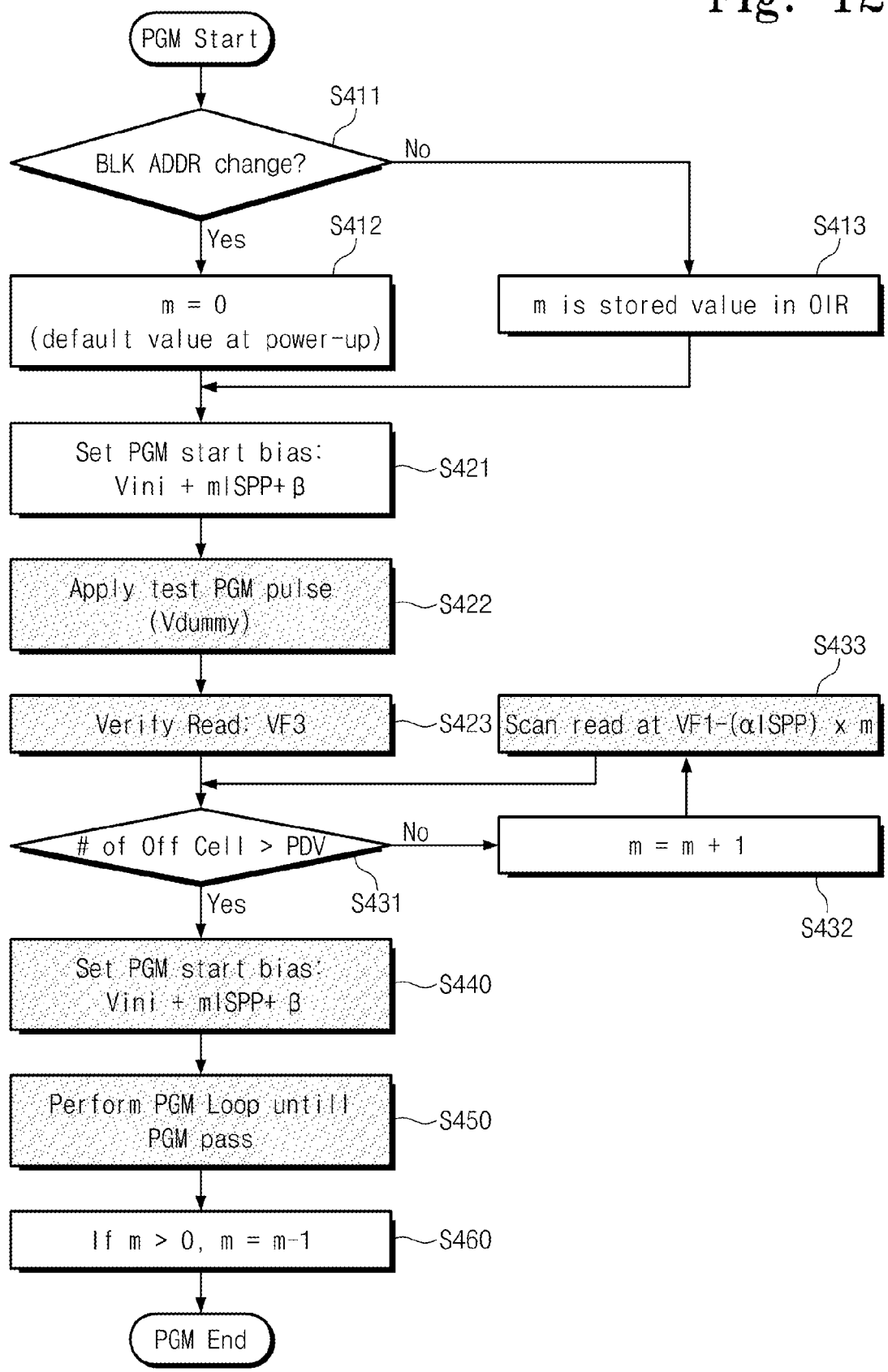
FIG. 12 is a flowchart illustrating the method of FIG. 10.

FIG. 12 is a flowchart illustrating the method of FIG. 10. In the example of FIG. 12, with the exception of operations S422, S423, S433, S440, and S450, the illustrated operations are the same as corresponding operations of FIG. 8, so a description thereof is thus omitted. In operation S422, a dummy voltage Vdummy is applied as a test program pulse. The dummy voltage Vdummy is higher than a loop start voltage Vini. In operation S423, a verification read operation is performed using a third verification voltage VF3. Herein, the third verification voltage VF3 may be a voltage for verifying a third program state P3 (See, FIG. 4). In operation S433, a read operation (a part of a scan read operation) may be performed using a scan read voltage (VF3−(αISPP)×m). In operation S440, a program start bias may include loop start voltage Vini and the offset voltage (mISPP+β). The program start bias in operation S440 corresponds to a value of a program start bias in S240 of FIG. 8-ΔVpgm. In operation S450, a program loop is iterated using a calculated offset voltage Voffset (See, FIGS. 10 and 11) according to one of a default path and an offset path (See, FIG. 7) until a program operation is passed. A program operation may be failed when a program operation is not passed at a last program loop.

In the method of FIG. 12, a dummy voltage Vdummy is applied as a test program pulse for offset setting, a third verification voltage VF3 is applied as a test verification pulse, an offset voltage Voffset corresponding to a scan read region SRR is calculated, and the calculated offset voltage Voffset is used as a program start bias of a program loop.

In FIGS. 6 to 12, an offset voltage Voffset calculated in an offset setting period is applied to a next program loop. Also, the offset setting period may be prior to a program loop. However, the inventive concept is not limited thereto. The method may include various combinations of the offset setting period and program loops.

Figure 13A:
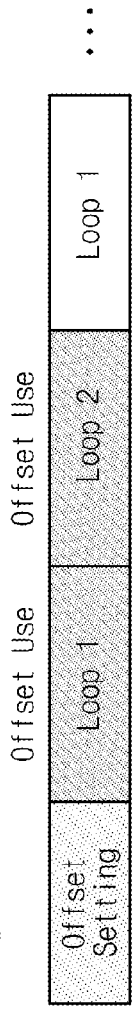
FIGS. 13A to 13E show various combinations of an offset period and program loops.
Figure 13B:
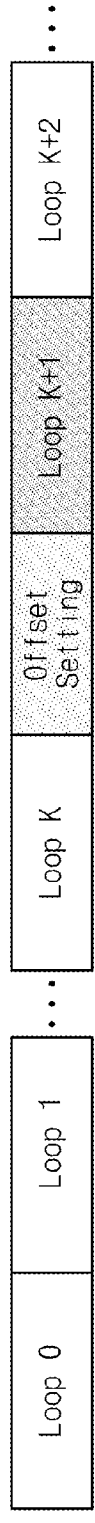
Figure 13C:
Figure 13D:
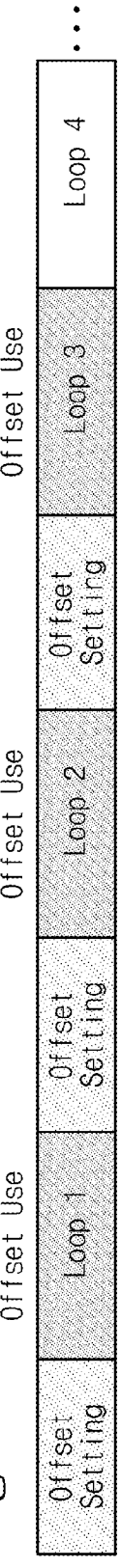
Figure 13E:

FIGS. 13A to 13E show various combinations of an offset period and program loops. In FIG. 13A, an offset voltage determined at an offset setting period is applied to next program loops. In FIG. 13B, an operation corresponding to an offset setting period may be performed after some program loops are executed. In FIG. 13C, an offset voltage Voffset determined at an offset setting period after some program loops are executed is applied to next program loops. In FIG. 13D, an operation corresponding to an offset setting period may be performed prior to each program loop. In FIG. 13E, after some program loops are executed, an operation corresponding to an offset setting period may be performed prior to the remaining program loops other than some program loops.

A one-shot method of programming a nonvolatile memory device according to an embodiment of the inventive concept can be applied to an on-chip buffered programming (OBP) technique. Examples of the OBP technique are disclosed in U.S. Patent Publication Nos. 2011/0194346, 2011/0205817, and 2011/0222342, the subject matter of which is incorporated by reference.

Figure 14:
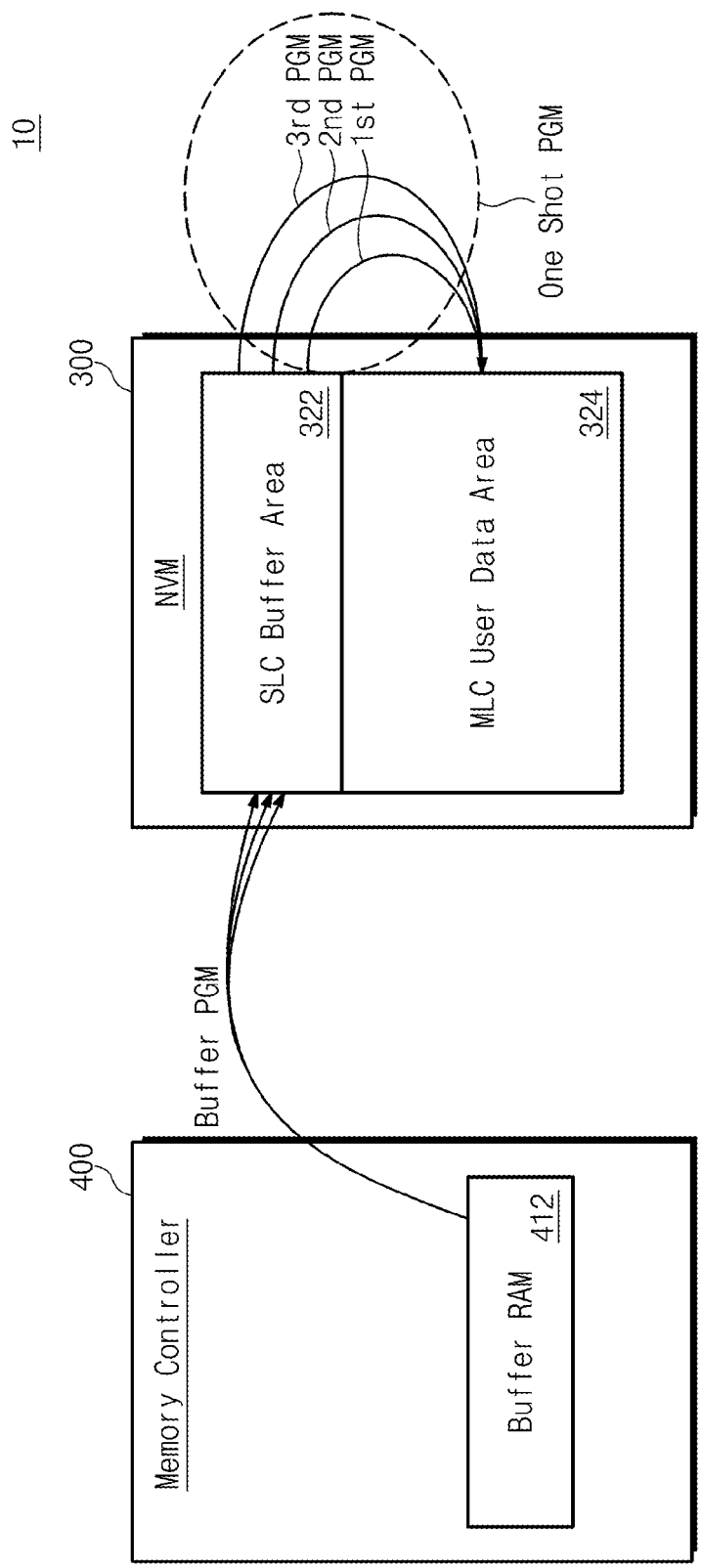
FIG. 14 is a block diagram illustrating an on-chip buffered programming method according to an embodiment of the inventive concept.

FIG. 14 is a block diagram illustrating an on-chip buffered programming method according to an embodiment of the inventive concept.

Referring to FIG. 14, a memory system 10 comprises a nonvolatile memory device 300 and a memory controller 400 controlling the nonvolatile memory device 300.

With the on-chip buffered programming, data of a buffer RAM 412 in memory controller 10 may be programmed at an SLC buffer area 322 of the nonvolatile memory device 300. Data of SLC buffer area 322 is programmed at an MLC user data area 324 of the nonvolatile memory device 120 by performing first programming, second programming, and third programming sequentially. Buffer RAM 412 may be, for instance, a volatile memory such as DRAM or SRAM. A multi-bit (e.g., 3-bit) program operation may be accomplished by performing first programming, second programming, and third programming sequentially. The first programming, the second programming, and the third programming may perform the same multi-bit program operation. At least one of the first programming, the second programming, and the third programming may be performed according to a one-shot program operation.

FIG. 15 is a block diagram illustrating a memory system according to an embodiment of the inventive concept.

Referring to FIG. 15, a memory system 1000 comprises at least one nonvolatile memory device 1100 and a memory controller 1200. Nonvolatile memory device 1100 may be configured to perform a one-shot program operation described with reference to FIGS. 1 to 14.

Nonvolatile memory device 1100 may be optionally supplied with a high voltage Vpp from an external device. Memory controller 1200 is connected with nonvolatile memory device 1100 via multiple channels. Memory controller 1200 comprises at least one Central Processing Unit (CPU) 1210, a buffer memory 1220, an ECC circuit 1230, a ROM 1240, a host interface 1250, and a memory interface 1260. Although not shown in FIG. 15, memory controller 1200 may further comprise a randomization circuit that randomizes and de-randomizes data. Memory system 1000 may be applicable to a perfect page new (PPN) memory. Certain examples of memory systems which may be adapted to incorporate certain embodiments of the inventive concept are disclosed in U.S. Pat. No. 8,027,194 and U.S. Patent Publication No. 2010-0082890, the subject matter of which are herein incorporated by reference.

As indicated by the foregoing, in certain embodiments of the inventive concept, an offset voltage may be determined according to a scan operation, and a program start bias may be adjusted using the offset voltage. Nevertheless, the inventive concept is not limited thereto. For instance, the inventive concept may be modified such that an offset time is determined according to a scan operation and a program start bias is adjusted using the offset time. Herein, the offset time may be associated with a time when a pulse is applied. Moreover, as indicated by the foregoing, performance and power consumption may be improved by calculating an offset using a scan read operation and performing a program operation using the offset calculated.

The foregoing is illustrative of embodiments and is not to be construed as limiting thereof. Although a few embodiments have been described, those skilled in the art will readily appreciate that many modifications are possible in the embodiments without departing from scope of the inventive concept as defined in the claims.

What is claimed is:

1. A method of programming a nonvolatile memory device, the method comprising:
   applying at least one test program pulse to selected memory cells located in a scan read area of the nonvolatile memory device;
   performing a scan read operation on the selected memory cells, following the application of the at least one test program pulse, to determine a read operation voltage at which a predetermined number of one-shot upper cells are identified;
   calculating an offset voltage based on the difference between the determined read operation voltage and a reference voltage;
   setting a program start bias using the offset voltage; and
   executing at least one program loop using the program start bias,
   wherein the scan read operation comprises, increasing/decreasing the read operation voltage, performing another read operation, by applying the increased/decreased read operation voltage, iterating operations the increasing/decreasing and the performing another read operation until the number of off cells detected during the other read operation exceeds a predetermined number, and establishing the read operation voltage applied in the last iterations the increasing/decreasing and the performing another read operation as an offset index.

2. The method of claim 1, wherein the at least one test program pulse corresponds to a loop start voltage of the at least one program loop.

3. The method of claim 1, wherein the at least one test program pulse is a dummy voltage higher than a loop start voltage of the at least one program loop.

4. The method of claim 1, further comprising determining whether to perform the scan read operation.

5. The method of claim 4, wherein the determining whether to perform the scan read operation comprises performing a verification read operation using a test verification pulse.

6. The method of claim 4, wherein program loops are executed according to a predetermined default path when the scan read operation is not performed and according to an offset path using the offset voltage when the scan read operation is performed.

7. The method of claim 1, wherein, during the scan read operation, the read operation is performed, proceeding from a down point of a scan read region to a top point of the scan read region by a unit voltage.

8. The method of claim 1, wherein during the scan read operation, the read operation is performed, proceeding from a top point of a scan read region to a down point of the scan read region by a unit voltage.

9. The method of claim 8, wherein the down point is determined where the number of one-shot upper cells exceeds the predetermined number.

10. The method of claim 9, wherein the predetermined number is all cells.

11. The method of claim 9, wherein the top point corresponds to a voltage level of the test verification pulse.

12. The method of claim 8, wherein the top or down point of the scan read region is changed according to at least one of a temperature of the nonvolatile memory device, wear-leveling associated with memory cells to be programmed, and structural location information of memory cells to be programmed.

13. The method of claim 1, wherein the selected memory cells are in a string formed of a pillar penetrating word line substrates stacked in a direction perpendicular to a substrate.

14. A method of programming a nonvolatile memory device, the method comprising:
   applying a test program pulse to memory cells to be programmed within a memory block;
   applying a test verification pulse to the memory cells to verify programming by the test program pulse;
   performing a scan read operation of the memory cells;
   changing an offset index in an offset index register according to a result of the scan read operation, the offset index stored at an offset index register according to a block address of the memory block comprising the memory cells;
   setting a program start bias using the offset index; and
   iterating program loops using the program start bias until a program operation is passed,
   wherein the scan read operation comprises:
      (a) performing a read operation, by applying a read operation voltage,
      (b) increasing/decreasing the read operation voltage,
      (c) performing another read operation, by applying the increased/decreased read operation voltage,
      (d) iterating operations (b) and (c) until the number of off cells detected during the other read operation exceeds a predetermined number, and
      (e) establishing the read operation voltage applied in the last iteration of operations (b) and (c) as the offset index.

15. The method of claim 14, wherein the offset index register stores a default value at power-up of the nonvolatile memory device and the program start bias comprises a loop start voltage of a program loop and an offset voltage corresponding to the offset index.

16. A nonvolatile memory device, comprising:
   a controller configured to:
      apply at least one test program pulse to selected memory cells located in a scan read area of the nonvolatile memory device,
      perform a scan read operation on the selected memory cells, following the application of the at least one test program pulse, to determine a read operation voltage at which a predetermined number of one-shot upper cells are identified,
      calculate an offset voltage based on the difference between the determined read operation voltage and a reference voltage,
      set a program start bias using the offset voltage, and
      execute at least one program loop using the program start bias,
   wherein the scan read operation comprises, increasing/decreasing the read operation voltage, performing another read operation, by applying the increased/decreased read operation voltage, iterating operations the increasing/decreasing and the performing another read operation until the number of off cells detected during the other read operation exceeds a predetermined number, and establishing the read operation voltage applied in the last iterations the increasing/decreasing and the performing another read operation as an offset index.

17. The nonvolatile memory device of claim 16, wherein the at least one test program pulse corresponds to a loop start voltage of the at least one program loop.

18. The nonvolatile memory device of claim 16, wherein the at least one test program pulse is a dummy voltage higher than a loop start voltage of the at least one program loop.

19. The nonvolatile memory device of claim 16, wherein the controller is further configured to determine whether to perform the scan read operation.

20. The nonvolatile memory device of claim 19, wherein the determination of whether to perform the scan read operation comprises performing a verification read operation using a test verification pulse.

* * * * *